United States Patent [19]
Ozawa et al.

[11] Patent Number: 6,081,319
[45] Date of Patent: *Jun. 27, 2000

[54] ILLUMINATION SYSTEM AND SCAN TYPE EXPOSURE APPARATUS

[75] Inventors: Kunitaka Ozawa; Eiji Sakamoto; Kazuhiro Takahashi, all of Utsunomiya; Youzou Fukagawa, Tochigi-ken, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/578,339

[22] Filed: Dec. 26, 1995

[30] Foreign Application Priority Data

Dec. 28, 1994 [JP] Japan ................................ 6-327450
Dec. 21, 1995 [JP] Japan ................................ 7-333305

[51] Int. Cl.$^7$ ................. G03B 27/54; G03B 27/42; G03B 27/72

[52] U.S. Cl. ................. 355/67; 355/53; 355/71

[58] Field of Search .................. 355/53, 67, 71

[56] References Cited

U.S. PATENT DOCUMENTS

| | | | |
|---|---|---|---|
| 3,823,318 | 7/1974 | Krause | 250/214 P |
| 4,316,665 | 2/1982 | Mochizuki et al. | 355/1 |
| 4,519,692 | 5/1985 | Michalik | 354/412 |
| 4,711,568 | 12/1987 | Torigoe et al. | 355/68 |
| 4,804,978 | 2/1989 | Tracy | 346/108 |
| 4,822,975 | 4/1989 | Torigoe | 219/121.85 |
| 4,884,101 | 11/1989 | Tanimoto | 355/68 |
| 4,947,047 | 8/1990 | Muraki | 250/492.2 |
| 4,970,546 | 11/1990 | Suzuki et al. | 355/53 |
| 4,974,919 | 12/1990 | Muraki et al. | 350/6.6 |
| 5,053,614 | 10/1991 | Yui et al. | 250/205 |
| 5,107,275 | 4/1992 | Tsuruoka et al. | 346/1.1 |
| 5,119,390 | 6/1992 | Ohmori | 372/25 |
| 5,171,965 | 12/1992 | Suzuki et al. | 219/121.6 |
| 5,191,374 | 3/1993 | Hazama et al. | 355/43 |
| 5,250,797 | 10/1993 | Sano et al. | 250/205 |
| 5,289,231 | 2/1994 | Magome et al. | 355/53 |
| 5,291,240 | 3/1994 | Jain | 355/53 |
| 5,475,491 | 12/1995 | Shiozawa | 356/394 |
| 5,477,304 | 12/1995 | Nishi | 355/53 |
| 5,491,534 | 2/1996 | Shiozawa | 355/69 |
| 5,608,492 | 3/1997 | Sato | 355/68 |
| 5,642,183 | 6/1997 | Sugihara et al. | 355/71 |
| 5,644,383 | 7/1997 | Mori | 355/68 |
| 5,663,784 | 9/1997 | Tanimoto | 355/68 |
| 5,673,103 | 9/1997 | Inoue et al. | 355/71 |
| 5,684,566 | 11/1997 | Stanton | 355/67 |
| 5,721,608 | 2/1998 | Taniguchi | 355/53 |
| 5,963,305 | 10/1999 | Mizouchi | 355/67 |

FOREIGN PATENT DOCUMENTS 61-97830  5/1986  Japan .

*Primary Examiner*—Safet Metjahic
*Assistant Examiner*—Christopher Mahoney
*Attorney, Agent, or Firm*—Fitzpatrick, Cella, Harper & Scinto

[57] ABSTRACT

An illumination system includes a light source for providing pulse light, and a scanning system for relatively and scanningly moving an article, to be illuminated, relative to an illumination region to be defined by the pulse light, wherein, in a light intensity distribution defined in the illumination region with respect to a scan direction, the light intensity changes non-linearly from an least one end portion to a highest light intensity point in the distribution, wherein the light intensity distribution includes a first point at the one end portion, a second point whereat light intensity increase changes, a third point whereat light intensity increase changes, and a fourth point whereat the light intensity is highest, and wherein at least one of a width Wa between the first and second points and a width Wb between the third and fourth points substantially corresponds to or is greater than the relative movement amount between the illumination region and the article per pulse.

39 Claims, 13 Drawing Sheets

ILLUMINATION SYSTEM AND SCAN TYPE EXPOSURE APPARATUS

FIELD OF THE INVENTION AND RELATED ART

This invention relates to an illumination system and, more particularly, to an illumination system suitably usable in manufacture of devices such as semiconductor devices (ICs, LSIs, etc.), liquid crystal devices, image pickup devices (CCDs, etc.) or magnetic heads. In another aspect, the invention is concerned with an exposure apparatus, more particularly, a scan type exposure apparatus, suitably usable in the manufacture of microdevices such as described above.

Generally, scan type exposure apparatuses use a continuous emission type light source such as a Hg lamp, for example. Since the pattern resolution is proportional to the wavelength of illumination light, use of a light source which is able to emit light in the deep ultraviolet region, of shorter wavelength, is desired in order to meet further increases of integration of a circuit. While light from a Hg lamp in the deep ultraviolet region may be used, it is not easy to obtain an output enough for use in an exposure apparatus. On the other hand, a sufficient output of short wavelength light in the deep ultraviolet region may be provided by an excimer laser, and use of the same has been considered effective.

In an occasion where a scanning exposure process is to be performed with an exposure apparatus having, as a light source, an excimer laser which is a pulse emission laser, in order to attain a desired exposure amount, the scan speed of a reticle and a wafer should be determined so that the wafer is irradiated with pulse light by a number times corresponding to the desired exposure amount. Hereinafter, this "desired exposure amount" will be referred to as "target integration exposure amount".

In a case where the exposure process is performed with pulse light having a rectangular intensity distribution with respect to the scan direction and where the width of illumination range by the pulse light upon the reticle (or wafer) in the scan direction corresponds to the product of M×N (M is the movement amount of the reticle (or wafer) per pulse and N is an integer), every exposure zone is irradiated with the same number of light pulses. Thus, there does not occur non-uniformness in exposure. However, if the exposure process is performed with a scan speed which does not satisfy the above-mentioned relation, overlapping occurs at the pulse light boundary. This causes exposure non-uniformness of a quantity corresponding to one pulse. Such non-uniformness corresponding to one pulse might be disregarded if the number of pulses to be used for the exposure is large (e.g. more than several hundreds). However, if the exposure pulse number is made smaller for enhanced throughput, the exposure non-uniformness corresponding to one pulse raises a problem.

SUMMARY OF THE INVENTION

It is an object of the present invention to provide an illumination system suitably usable in a scan type exposure apparatus, for example, having a light source of pulse emission type, such as an excimer laser, for example, by which a illumination system the exposure non-uniformness such as described above can be reduced.

In accordance with an aspect of the present invention, there is provided an illumination system, comprising: light source means for providing pulse light; and scanning means for relatively and scanningly moving an article, to be illuminated, relative to an illumination region to be defined by the pulse light; wherein, in a light intensity distribution defined in the illumination region with respect to a scan direction, the light intensity changes non-linearly from at least one end portion to a highest light intensity point in the distribution; wherein the light intensity distribution includes a first point at said one end portion, a second point whereat the light intensity increase changes, a third point whereat the light intensity increase changes, and a fourth point whereat the light intensity is highest; and wherein at least one of the width Wa between the first and second points and the width Wb between the third and fourth points substantially corresponds to or is greater than the relative movement amount between the illumination region and the article per pulse.

In one preferred form of this aspect of the present invention, the light intensity distribution may have a symmetrical shape with respect to the scan direction. The second and third points may be coincident with each other. The widths Wa and Wb may be equal to each other. Portions of the light intensity distribution corresponding to the widths Wa and Wb may be able to be approximated by a quadratic curve.

The light intensity distribution in the illumination region with respect to the scan direction may be defined by a masking blade disposed at a position out of a plane which is optically conjugate with the article. Alternatively, it may be defined by a filter for determining the light intensity distribution in the illumination region. The filter may be disposed at a position slightly deviated from a plane which is optically conjugate with the article. The filter may have a transmissivity changing with the position of light incidence on said filter. The filter may comprise a diffraction grating adapted to provide a zeroth order diffraction light whose light intensity changes with the position of light incidence on said grating. Blocking means may be provided to block diffraction light other than the zeroth order diffraction light.

The illumination system may include control means for controlling the emission time moment of a light pulse on the basis of a light quantity provided by a preceding light pulse. The pulse light may comprise excimer laser light.

In accordance with another aspect of the present invention, there is provided an illumination system, comprising: light source means for providing pulse light; and scanning means for relatively and scanningly moving an article, to be illuminated, relative to an illumination region to be defined by the pulse light; wherein a light intensity distribution defined in the illumination region with respect to a scan direction has a shape like a trapezoid in which the light intensity at at least one of four corners changes along a smooth curve; and wherein the width of at least one portion of the light intensity distribution in which the light intensity changes along a smooth curve corresponds to or is greater than the relative movement amount between the illumination region and the article per pulse.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
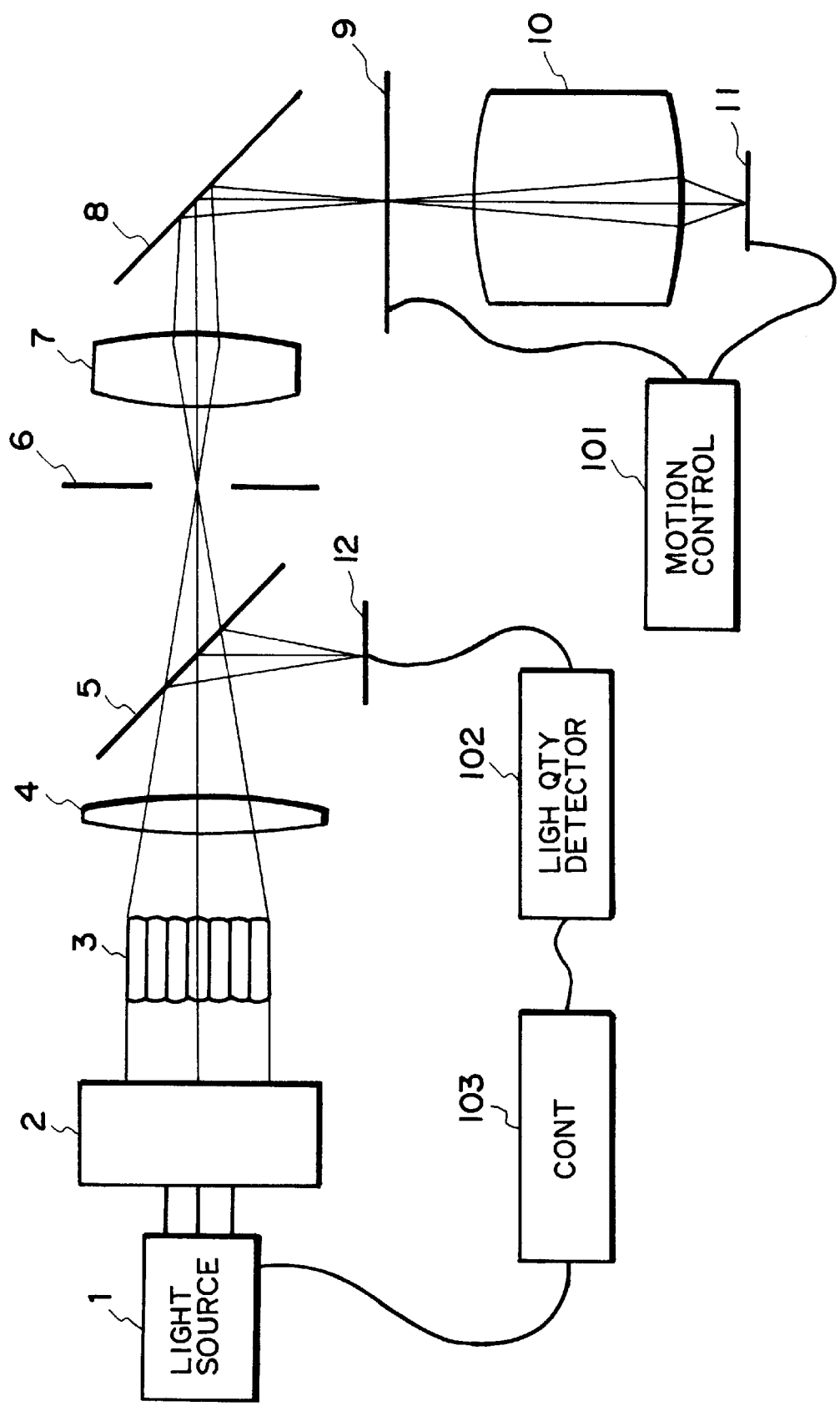
FIG. 1 is a schematic view of a scan type exposure apparatus according to an embodiment of the present invention.

FIG. 1 is a schematic view of a scan type projection exposure apparatus according to an embodiment of the present invention, which is suitably usable in the manufacture of microdevices such as semiconductor devices (e.g., ICs or LSIs), liquid crystal devices, image pickup devices (e.g., CCDs) and magnetic heads, for example.

In FIG. 1, light from a pulse light source 1 such as an excimer laser, for example, is shaped into a desired shape by a beam shaping optical system 2. The light from the beam shaping optical system 2 is directed to the light entrance surface of an optical integrator 3, such as a fly's eye lens. The fly's eye lens comprises a combination of small lenses, and it defines a plurality of secondary light sources in the vicinity of the light exit surface of the integrator.

Denoted at 4 is a condenser lens which serves to perform Koehler illumination of a masking blade 6 with light from the secondary light sources of the optical integrator 3. The masking blade 6 is disposed out of an optically conjugate relation with a reticle 9, with respect to an imaging lens 7 and a mirror 8. Once the shape of the opening of the masking blade 6 is determined, the shape and size of the illumination region upon the reticle to be provided by pulse light is determined. The illumination region upon the reticle has an oblong slit-like shape having its minor direction (widthwise direction) set along the scan direction of the reticle 9.

Denoted at 10 is a projection optical system for projecting, in a reduced scale, a circuit pattern of a reticle 9 onto a wafer 11. Denoted at 101 in a motion controlling system for moving, through a driving mechanism (now shown), the reticle 9 and the wafer 11 accurately at a constant speed and with the same ratio as the projection magnification of the projection optical system 10. Denoted at 12 is a light quantity detector. It serves to indirectly monitor the exposure amount upon the wafer by each pulse, by monitoring a portion of the pulse light divided by a half mirror 5. Control system 103 serves to control the timing of emission of the pulse light source in accordance with the measured exposure amount as calculated by a light quantity calculator 102.

Figure 2:
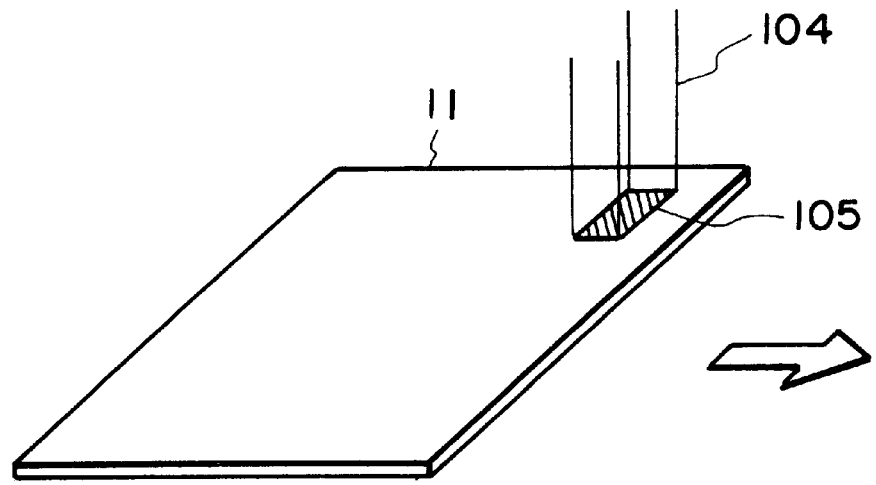
FIG. 2 is a schematic view for explaining an illumination region on a wafer, defined by a slit-like illumination light.
Figure 3:
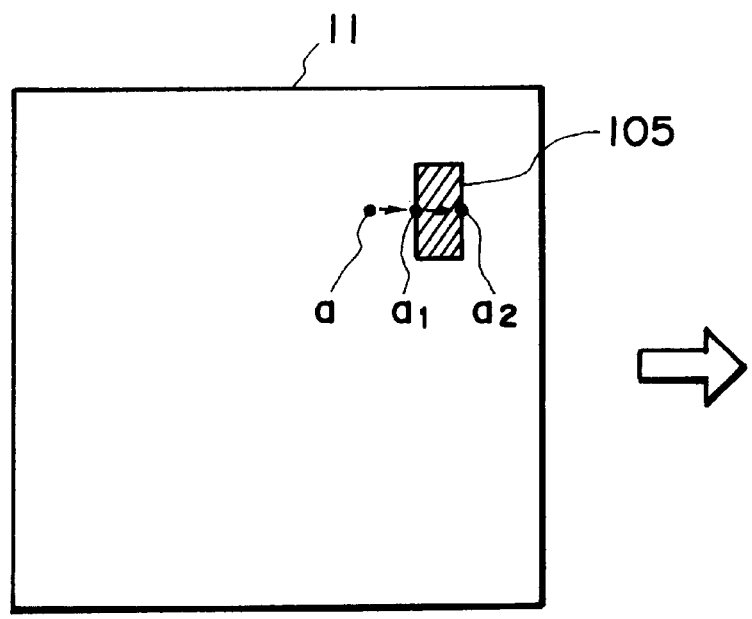
FIG. 3 is a schematic view for explaining displacement of a point on a wafer relative to the illumination region.

FIG. 2 illustrates the wafer 11 as moving, during the exposure process, in a direction of an arrow, perpendicular to the light path of illumination light 104 from the reticle 9, which light bears information about the pattern of the reticle 9. With the movement of the wafer 11 in the direction of the arrow of FIG. 2, the wafer 11 surface is scanningly exposed with the illumination region 105 defined by the slit-like light 104. FIG. 3 illustrates the wafer 11 of FIG. 2, as seen in the direction of illumination (i.e., from the above), and it shows that with the motion of the wafer 11 a particular point a on the wafer 11 displaces across the illumination region 105 (a→$a_1$→$a_2$). As the point a comes to the position $a_1$, the exposure of the point a starts. As the point a comes to the position $a_2$, the exposure of the point a ends.

Figure 4:
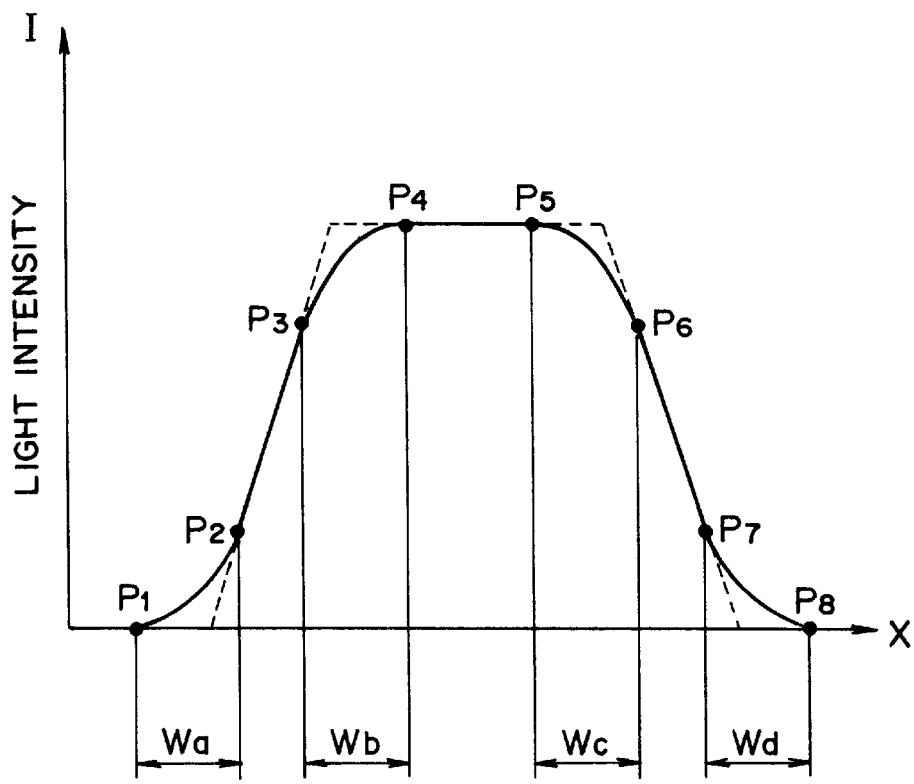
FIG. 4 is a graph for explaining the basic concept of a light intensity distribution of pulse light, according to the present invention.

FIG. 4 is a schematic view for explaining the basic concept of light intensity distribution of pulse light in the illumination region and with respect to the scan direction, according to the present invention. In the drawing, a reference character Wa denotes the width from a first point $P_1$ which is at a left-hand side end portion, as viewed in the drawing, to a second point $P_2$ whereat the manner of light intensity increase changes. A reference character Wb denotes the width from a third point $P_3$ whereat the manner of light intensity increase changes to a fourth point $P_4$ whereat the light intensity is highest. A reference character Wc denotes the width from a fifth point $P_5$ whereat the light intensity is highest to a sixth point $P_6$ whereat the manner of light intensity decrease changes. A reference character Wd denotes the width from a seventh point $P_7$ whereat the manner of light intensity decrease changes to an eleventh point $P_8$ which is at a right-hand side end portion.

Figure 5:
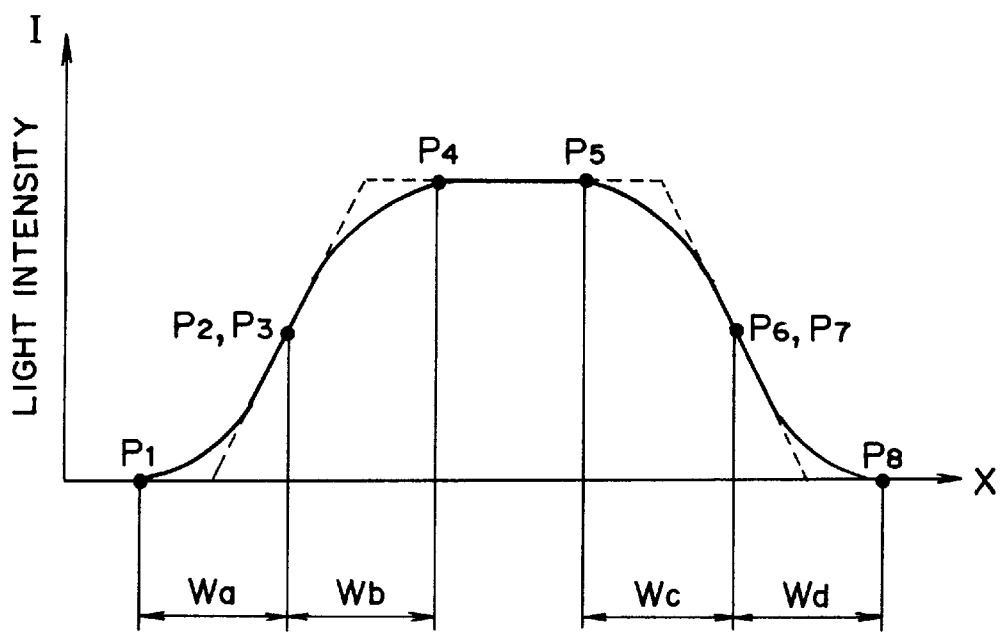
FIG. 5 is a graph for explaining an example of light intensity distribution of pulse light, according to the present invention.
Figure 6:
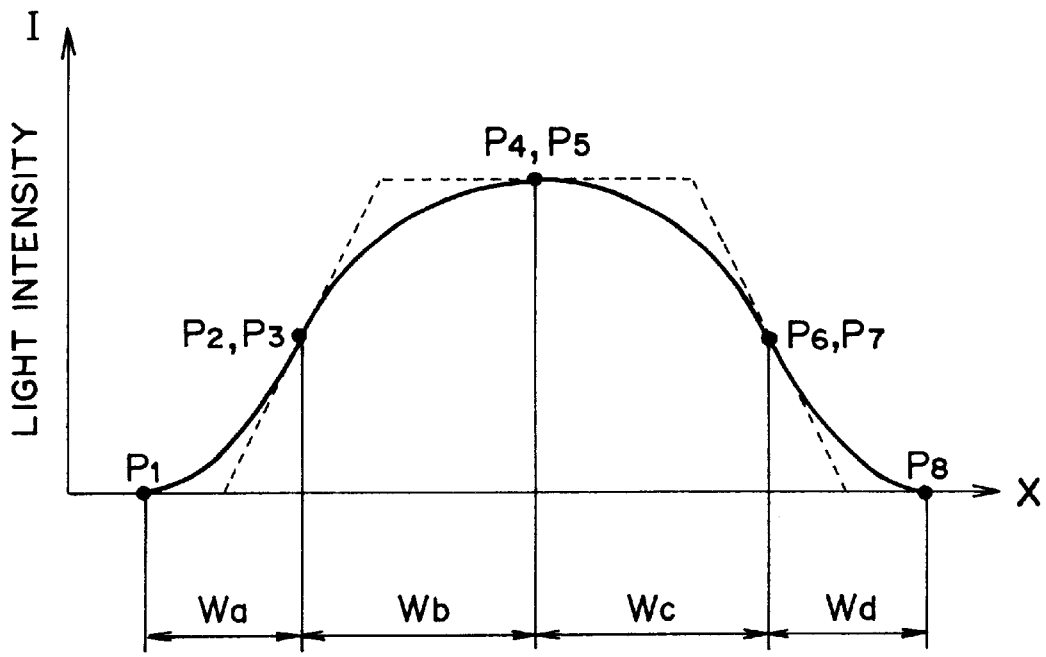
FIG. 6 is a graph for explaining another example of light intensity distribution of pulse light, according to the present invention.
Figure 7:
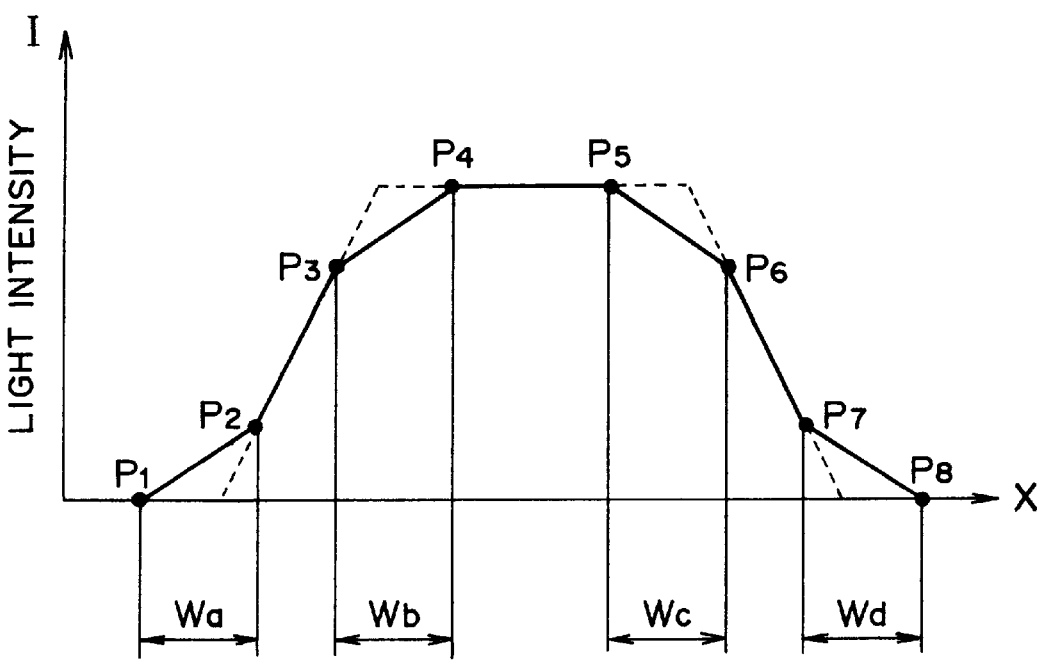
FIG. 7 is a graph for explaining a further example of light intensity distribution of pulse light, according to the present invention.
Figure 8:
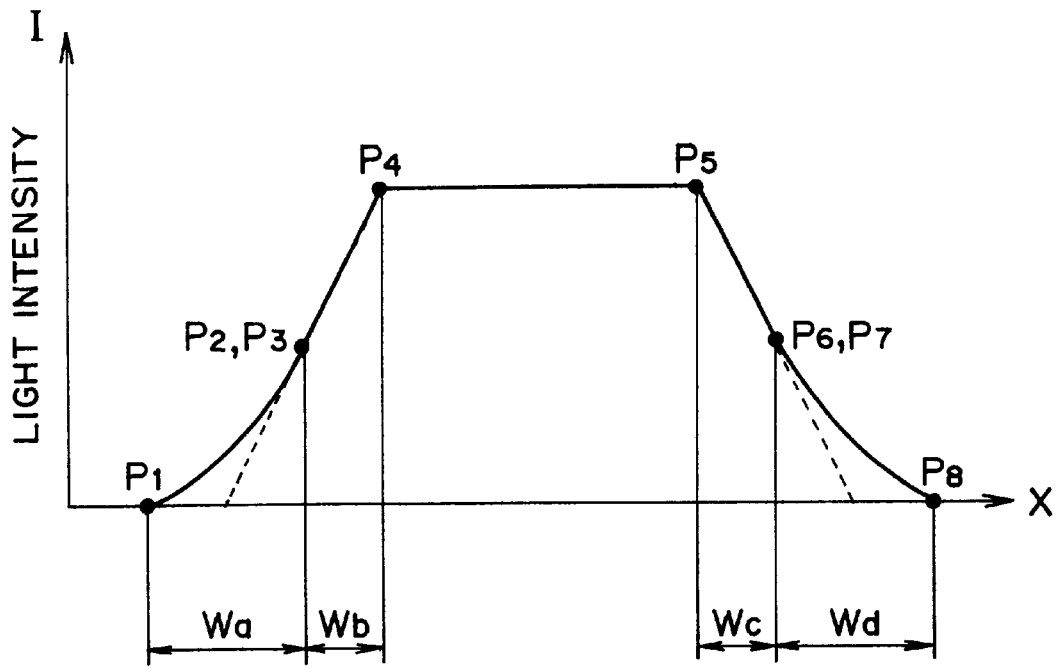
FIG. 8 is a graph for explaining a still further example of light intensity distribution of pulse light, according to the present invention.
Figure 9:
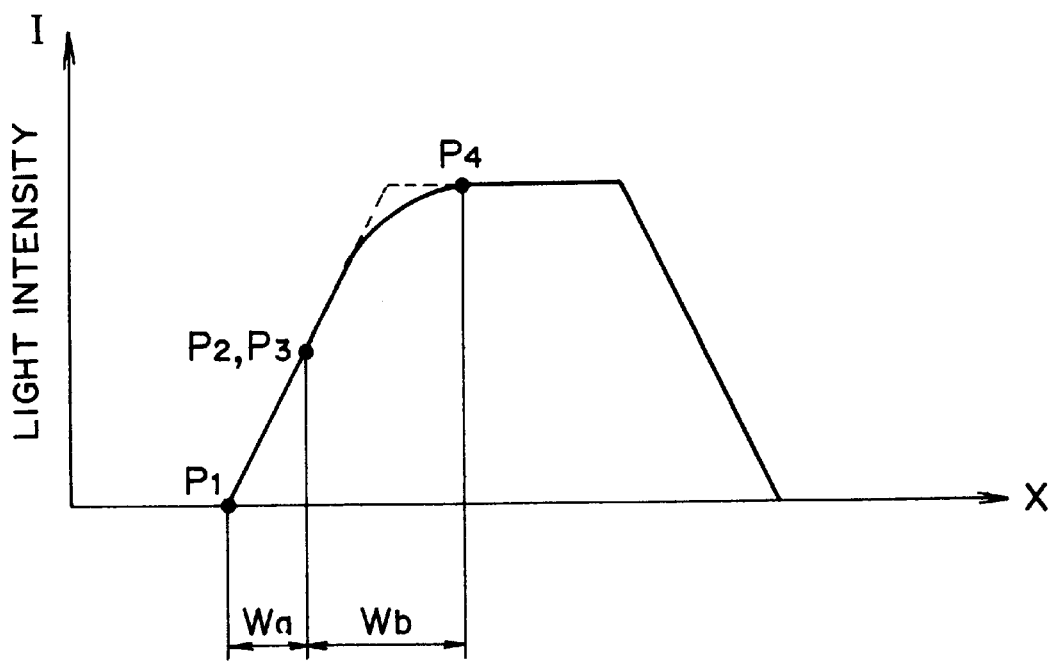
FIG. 9 is a graph for explaining a yet further example of light intensity distribution of pulse light, according to the present invention.

In addition to the one illustrated in FIG. 4, those light intensity distributions such as shown in FIGS. 5–9, for example, are applicable. FIG. 5 shows an example where the points whereat the light intensity increase or decrease changes are coincident with each other (points $P_2$ and $P_3$: points $P_6$ and $P_7$). FIG. 6 shows an example where, in addition to the condition of FIG. 5, the highest light intensity points are coincident with each other (points $P_4$ and $P_5$). FIG. 7 shows an example where the light intensity changes are straight. FIGS. 8 and 9 show examples corresponding to combinations of the light intensity distributions described above. In addition to those examples, various forms of light intensity distributions are applicable within the scope of the present invention.

The point whereat the light intensity increase or decrease changes, mentioned above, refers to such point across which a function that represents changes in light intensity changes or to a point of inflection where the function is unchanged.

Figure 10:
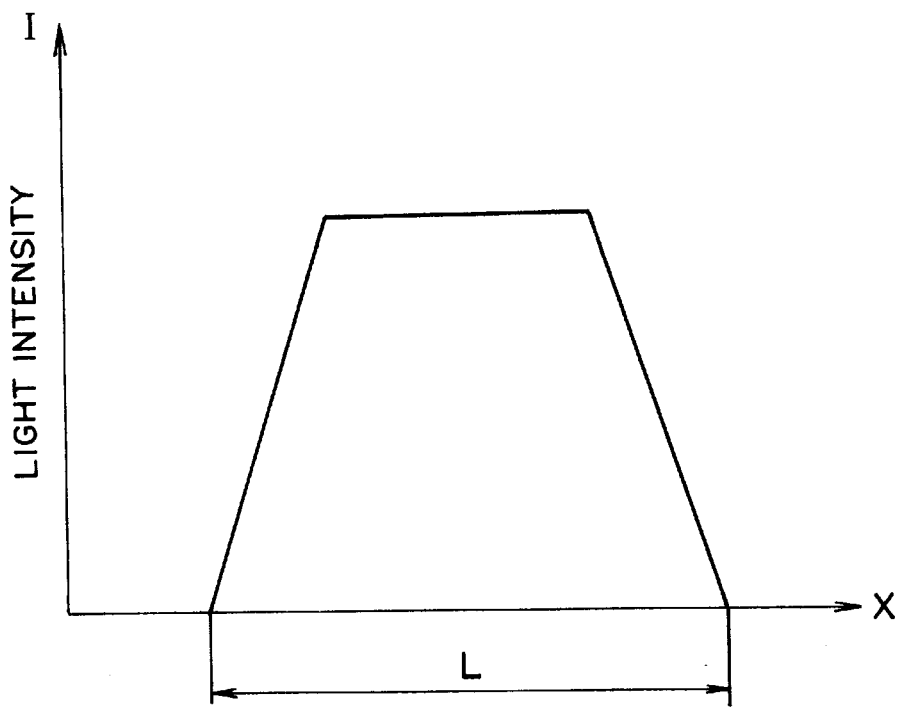
FIG. 10 is a graph for explaining a light intensity distribution of a pulse light, of trapezoidal shape.
Figure 11:
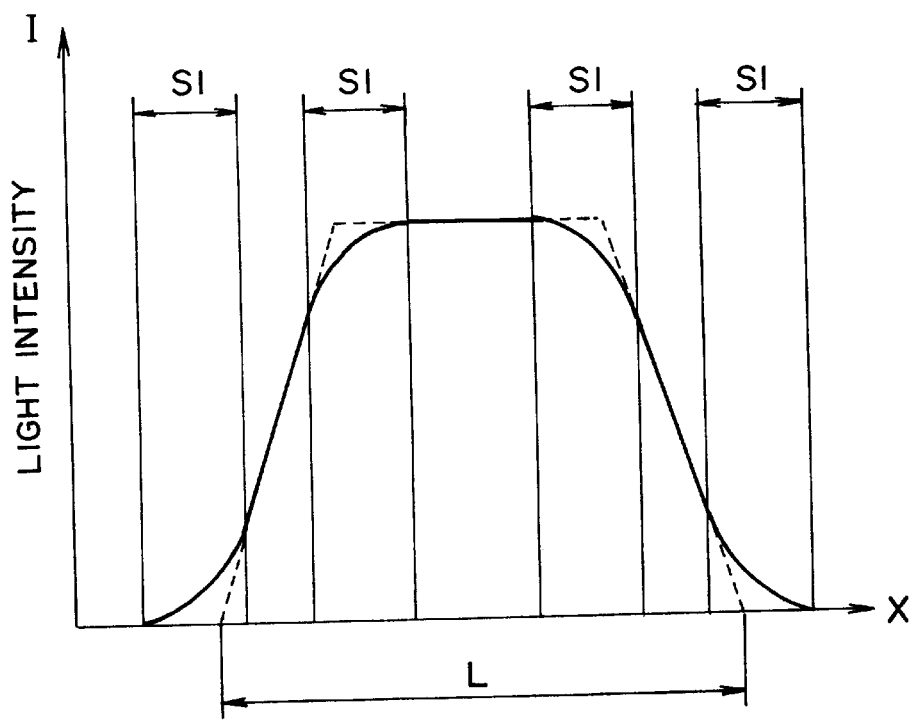
FIG. 11 is a graph for explaining a still further example of light intensity distribution of pulse light, according to the present invention.

FIG. 10 shows a light intensity distribution or pulse light, of a trapezoidal shape, having been used conventionally. FIG. 11 shows a light intensity distribution of pulse light, according to an embodiment of the present invention.

The light intensity distribution of the pulse light shown in FIG. 10 has a regular trapezoidal shape (with slants of the same length), having a top width of 3 mm and a bottom width of 5 mm, both upon the wafer 11 surface. As compared therewith, the light intensity distribution of the pulse light of the FIG. 11 embodiment has such a shape wherein corners of the trapezoidal light intensity distribution of the pulse light of FIG. 10 are rounded along a quadratic curve. In the light intensity distribution of the pulse light of FIG. 11, the widths corresponding to Wa, Wb, Wc and Wd in FIG. 4 are all the same, and they are denoted by the same reference character $S_1$. In this embodiment, the width $S_1$ is 0.25 mm upon the wafer 11 surface.

Figure 12:
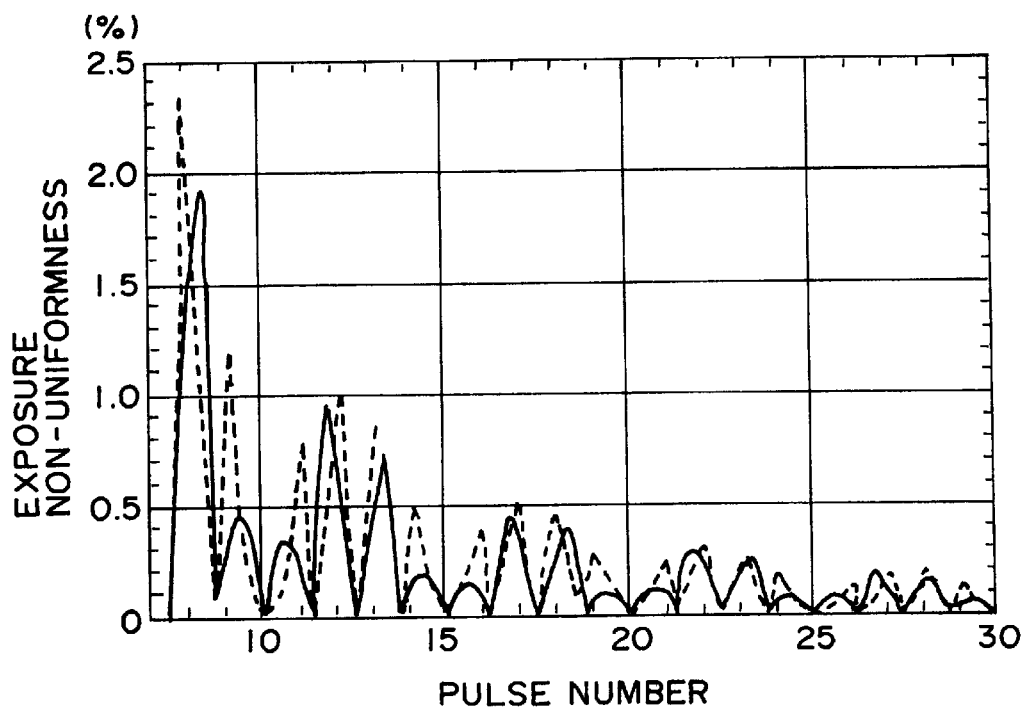
FIG. 12 is a graph for explaining the relationship between the pulse number and the exposure non-uniformness of pulse light having a light intensity distribution such as shown in FIG. 10.
Figure 13:
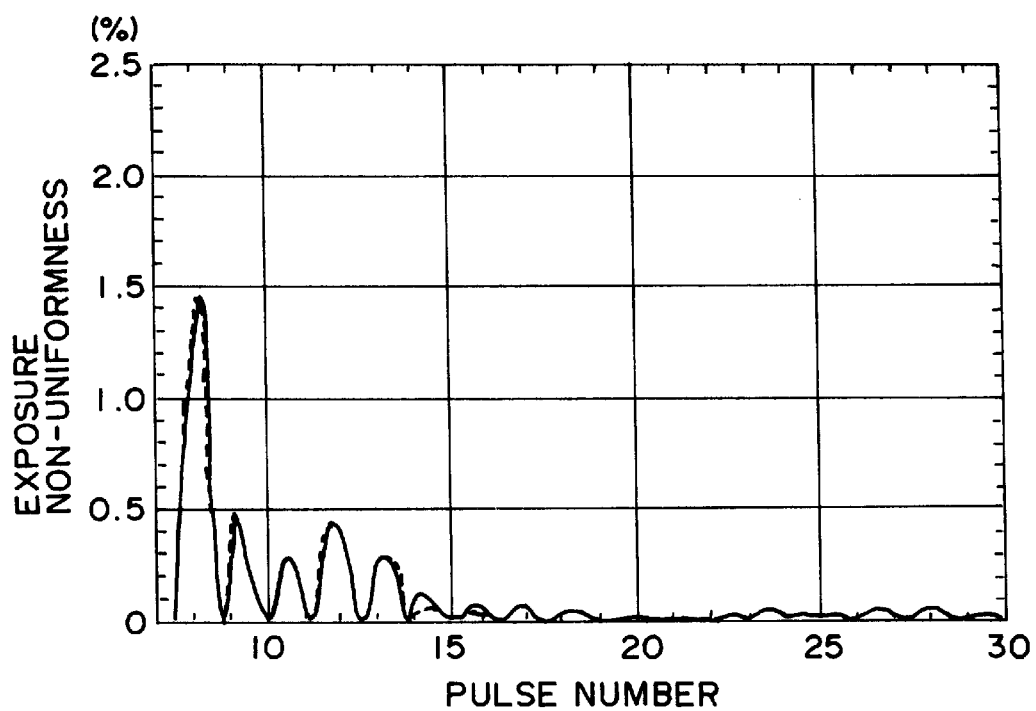
FIG. 13 is a graph for explaining the relationship between the pulse number and the exposure non-uniformness of pulse light having a light intensity distribution such as shown in FIG. 11.

FIG. 12 illustrates the relationship between the exposure non-uniformness and the pulse number, in a case where pulse light having a light intensity distribution of the FIG. 10 example is used. FIG. 13 illustrates the relationship between the exposure non-uniformness and the pulse number, in a case where pulse light having a light intensity distribution of the FIG. 11 embodiment is used. The term "pulse number" corresponds to a value resulting from dividing the width L of the illumination region on the wafer 11 surface by the movement amount of the wafer 11 per pulse, and it represents an average number of pulses with which a certain point in the exposure region is irradiated. Thus, the pulse number is not always an integral number. In the pulse light having an intensity distribution such as shown in FIG. 11, the width L is defined as illustrated in the drawing.

In FIGS. 12 and 13, curves of a solid line depict positive (+) side non-uniformness with reference to a target integration exposure amount, and curves of a broken line depict negative (−) side non-uniformness with reference to the target integration exposure amount.

Comparing the graph of FIG. 13 with the graph of FIG. 12, it is clear that the exposure non-uniformness is generally reduced in the case where the pulse light of the light intensity distribution of FIG. 11, than in the case where the pulse light of the light intensity distribution of FIG. 10.

Also, in FIG. 13, it is seen that in the pulse number range from about 20 (twenty) to more than 20 the exposure non-uniformness is reduced considerably. As the pulse number is equal to 20, the movement amount of the wafer 11 per pulse is equal to 0.25 mm. This is equal to the width $S_1$ in this embodiment. Namely, the pulse number range in FIG. 13 not lower than a pulse number 20, corresponds to a movement amount range in which the movement amount per pulse is not larger than 0.25 mm. Thus it is seen that, when the width $S_1$ is approximately equal to or not less than the movement amount per pulse, the exposure non-uniformness is reduced considerably.

This embodiment uses a masking blade 6 having two sets of orthogonal and variable slits. In this embodiment, of these slits, an image of the two variable slits in the direction serviceable to determine the width of the illumination region in the scan direction, can be defocused. Thus, the value of the width $S_1$ can be set as desired.

In this embodiment, an image of the opening of the masking blade 6 is projected through the imaging lens 7 onto the patterned surface of the reticle 9. However, use of the imaging lens 7 is not always necessary. As an example, the masking blade 6 may be disposed just before the reticle 9.

Figure 14:
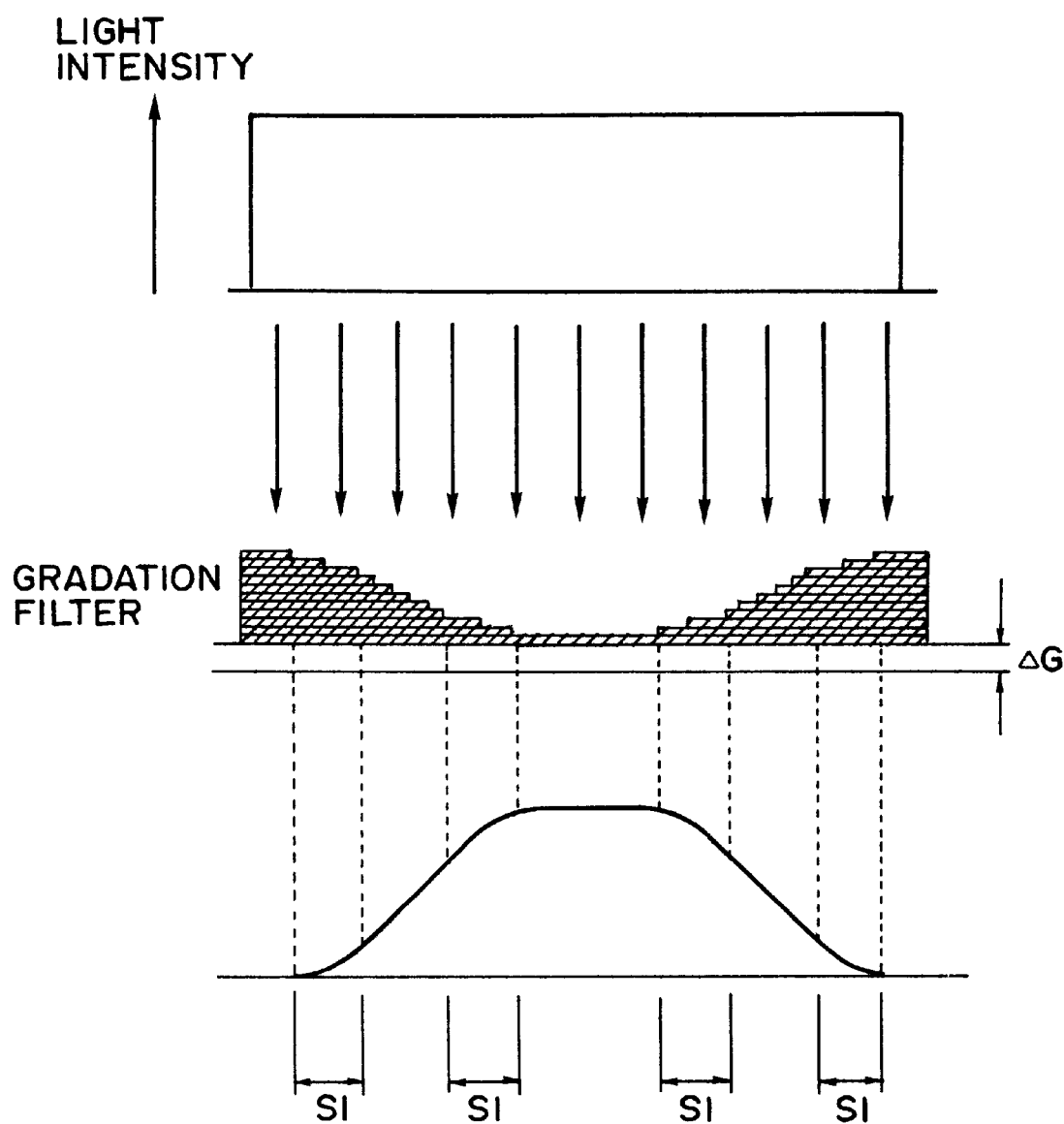
FIG. 14 is a schematic view for explaining the manner of setting a light intensity distribution with use of a gradation filter, in accordance with an embodiment of the present invention.

Also, the manner of setting the light intensity distribution is not limited to the abovedescribed example. An alternative is use of a gradation filter such as shown in FIG. 14, at the position of the masking blade 6. A further alternative is use of a grating filter such as shown in FIG. 15.

Gradation filter may be provided by partially superposing films, having a predetermined transmissivity or transmissivities, with each other such as illustrated in FIG. 14, so that the transmissivity changes with the position of light incidence. Thus, the gradation filter may provide a desired shape of light intensity distribution.

Figure 15:
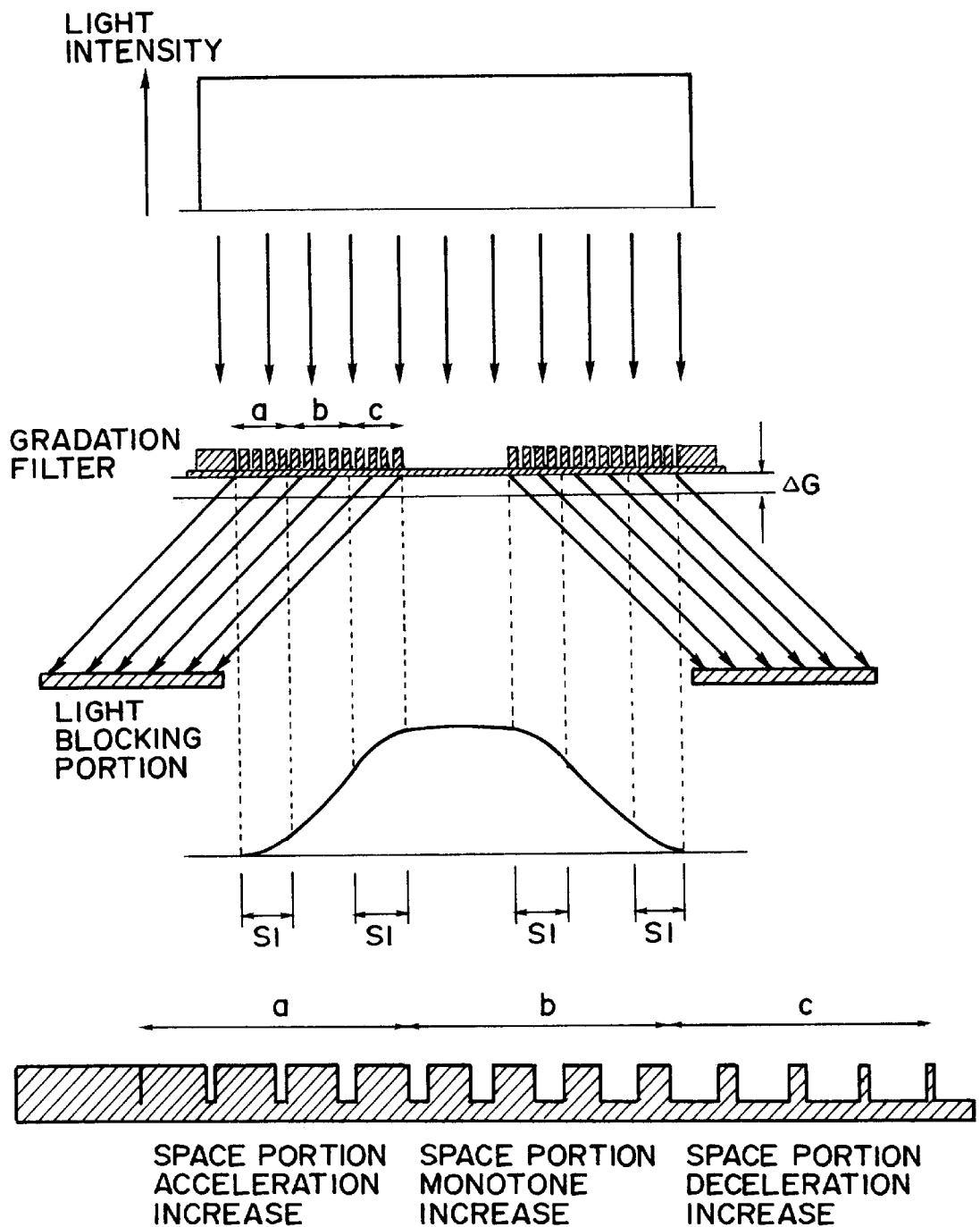
FIG. 15 is a schematic view for explaining the manner of setting a light intensity distribution with use of a grating filter, in accordance with an embodiment of the present invention.

Grating filter may comprise an amplitude type diffraction grating and, in the FIG. 15 example, it is arranged to provide a desired shape of light intensity distribution with a zeroth order light, as illustrated in FIG. 15. In this example, substantially all the diffraction lights other than the zeroth order light (diffraction light) are blocked by a light blocking member disposed at the back of the filter.

In the examples of FIGS. 14 and 15 using a gradation filter and a grating filter, the light intensity distribution may become interrupted. However, in that occasion, a smooth light intensity distribution is still obtainable by shifting the filter by $\Delta G$ (FIG. 14 or 15) from the optically conjugate position with the reticle 6. In the case of complicated light intensity distribution shape such as these examples, the width $S_1$ may be an approximated one.

Furthermore, a desired shape of light intensity distribution is obtainable by selecting the general shape of secondary light sources in the vicinity of the light exit surface of the fly's eye lens (such as out of circular, oblong, square, polygonal or a combination of any of them, for example).

Referring now to FIGS. 16–19, FIG. 16 illustrates that the integrated exposure amount at a certain point (point a in this example) on the wafer 11 increases with the movement of the wafer 11. Reference character $E_0$ denotes the target integration exposure amount. $T_1$ denotes the moment as the point a comes to the position $a_1$ (FIG. 3), that is, the moment as the point enters the illumination region (the moment of start of exposure). $T_2$ denotes the moment as the point a comes to the position $a_2$, that is, the moment as the point goes out the illumination region (the moment of end of exposure).

Figure 16:
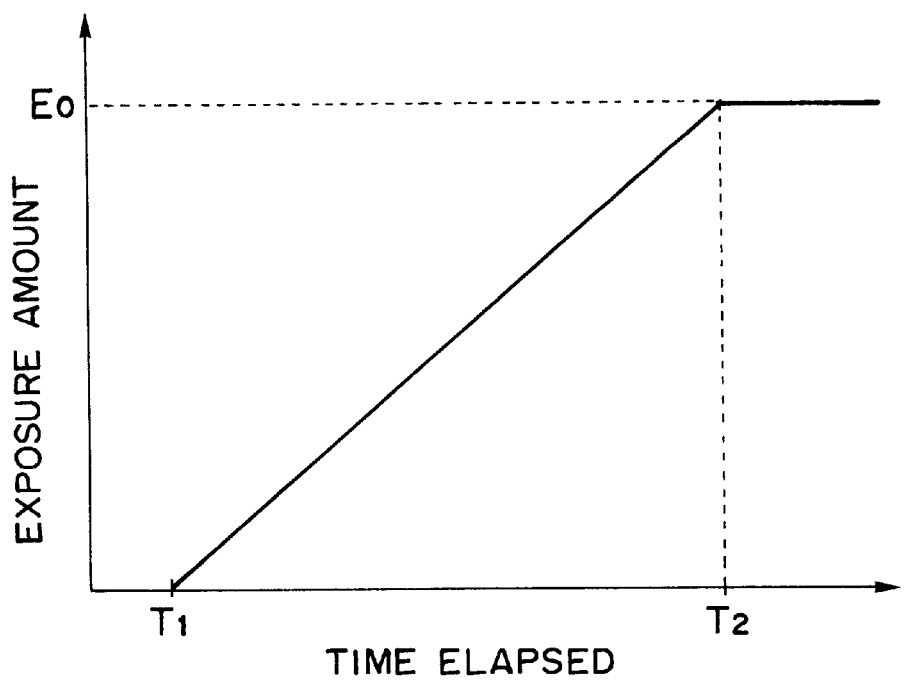
FIG. 16 is a graph for explaining integration of exposure amount, in a system having a continuous emission type light source.
Figure 17:
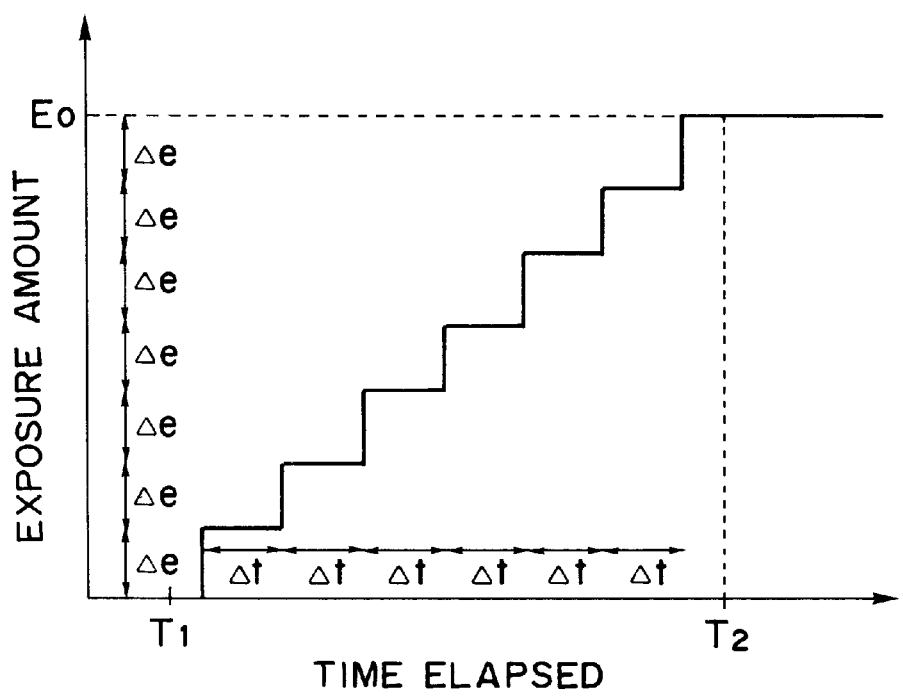
FIG. 17 is a graph for explaining integration of exposure amount, with light pulses of constant light quantity.

In a case where a continuous emission type light source such as a Hg lamp is used as an exposure light source, the exposure amount increases continuously from the start of exposure to the end of exposure, such as shown in FIG. 16. Thus, by determining the scan speed, the projection energy amount per unit time and the width of the illumination region beforehand and by performing the exposure process while keeping them constant, correct exposure control without exposure non-uniformness may be provided. Also, in a case where pulse light is used as the exposure light as in the present invention and if the projection energy amount per pulse is fixed constant, correct exposure control without exposure non-uniformness may be provided such as illustrated in FIG. 17, like the case where a continuous emission type light source is used.

Figure 18:
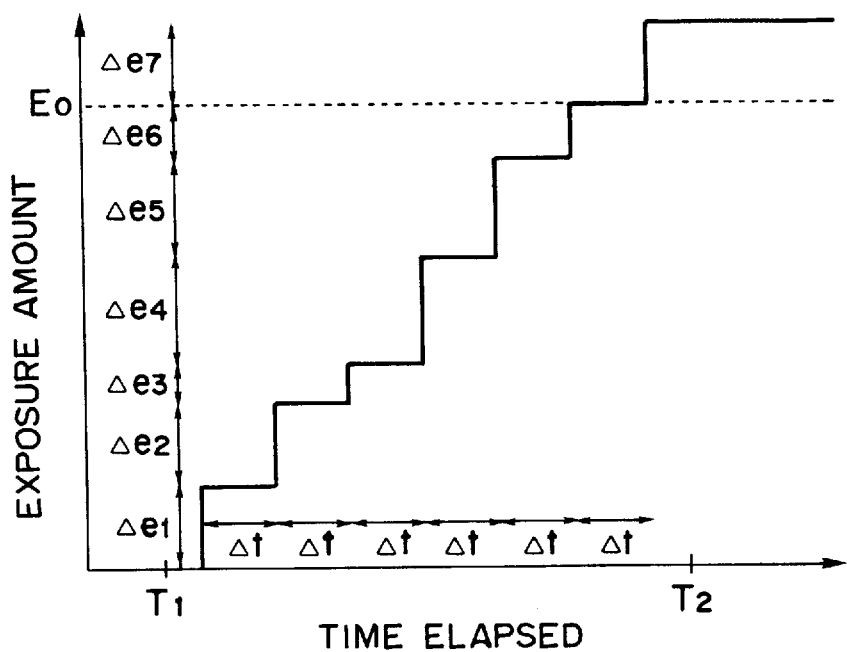
FIG. 18 is a graph for explaining integration of exposure amount, with light pulses of irregular light quantity.

However, as regards pulse light sources such as a excimer laser, while it is possible to maintain the light emission frequency constant, it is not easy to keep the pulse light energy exactly constant. Thus, even if the exposure process is performed exactly in accordance with the conditions as calculated from an average projection energy amount per pulse (e.g., in terms of the setting of energy, illumination slit width, scan speed of a reticle and a wafer, light emission frequency), correct exposure control is not attainable such as illustrated in FIG. 18, because of a variation or a shift of energy of each light pulse. This causes exposure non-uniformness particularly when the exposure process is to be performed in a substantially constant period as in the case of a scan type exposure apparatus.

Figure 19:
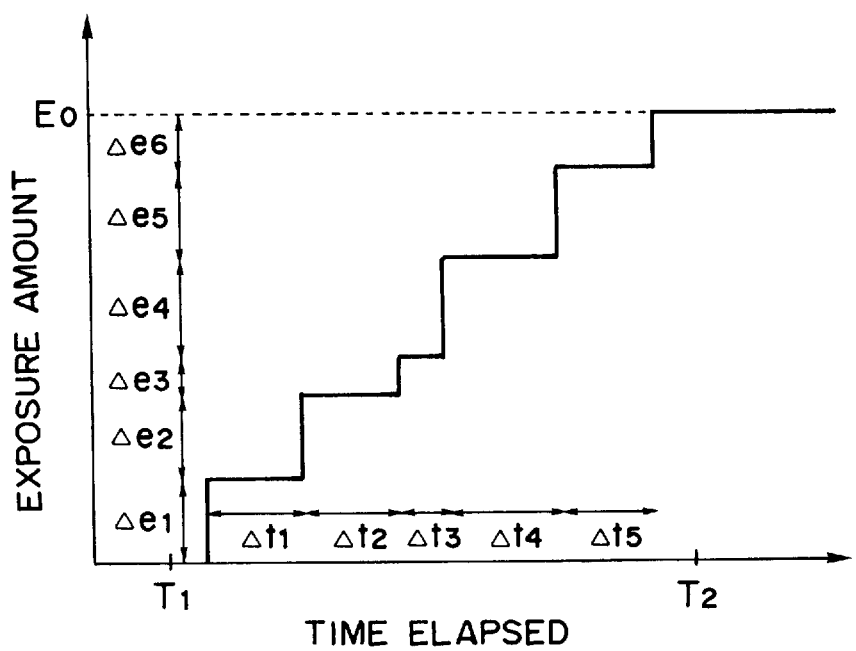
FIG. 19 is a graph for explaining integration of exposure amount, in accordance with an exposure amount controlling method according to an embodiment of the present invention.

FIG. 19 is a graph for explaining the exposure amount control according to an embodiment of the present invention. In this embodiment, the scan speed of the reticle 9 and the wafer 11 is kept constant, and the exposure amount provided by light pulses sequentially supplied during the scanning exposure is monitored through the light quantity detector 12. If the exposure amount provided by a certain light pulse is larger than a desired exposure amount, the timing of emission of a subsequent light pulse is retarded, under the control of the control system 103. If on the other hand the exposure amount provided by a certain light pulse is lower than the desired exposure amount, the timing of emission of a subsequent light pulse is advanced. This effectively reduces the exposure non-uniformness at each point on the wafer 11, even if light pulses have dispersed light quantities.

As regards the initial setting of the light emission frequency, energy dispersion of light pulses should be taken into account and the the frequency should preferably be set a value not greater than the maximum frequency of the pulse light source. As an example, if a laser has the energy dispersion of light pulses of ±5% and the maximum frequency of 500 Hz, the light emission frequency should initially be set to a level not higher than 500×100/105 (Hz) which is approximately equal to 476 Hz.

Next, an embodiment of semiconductor device manufacturing method which uses a projection exposure apparatus of FIG. 1, will be explained.

Figure 20:
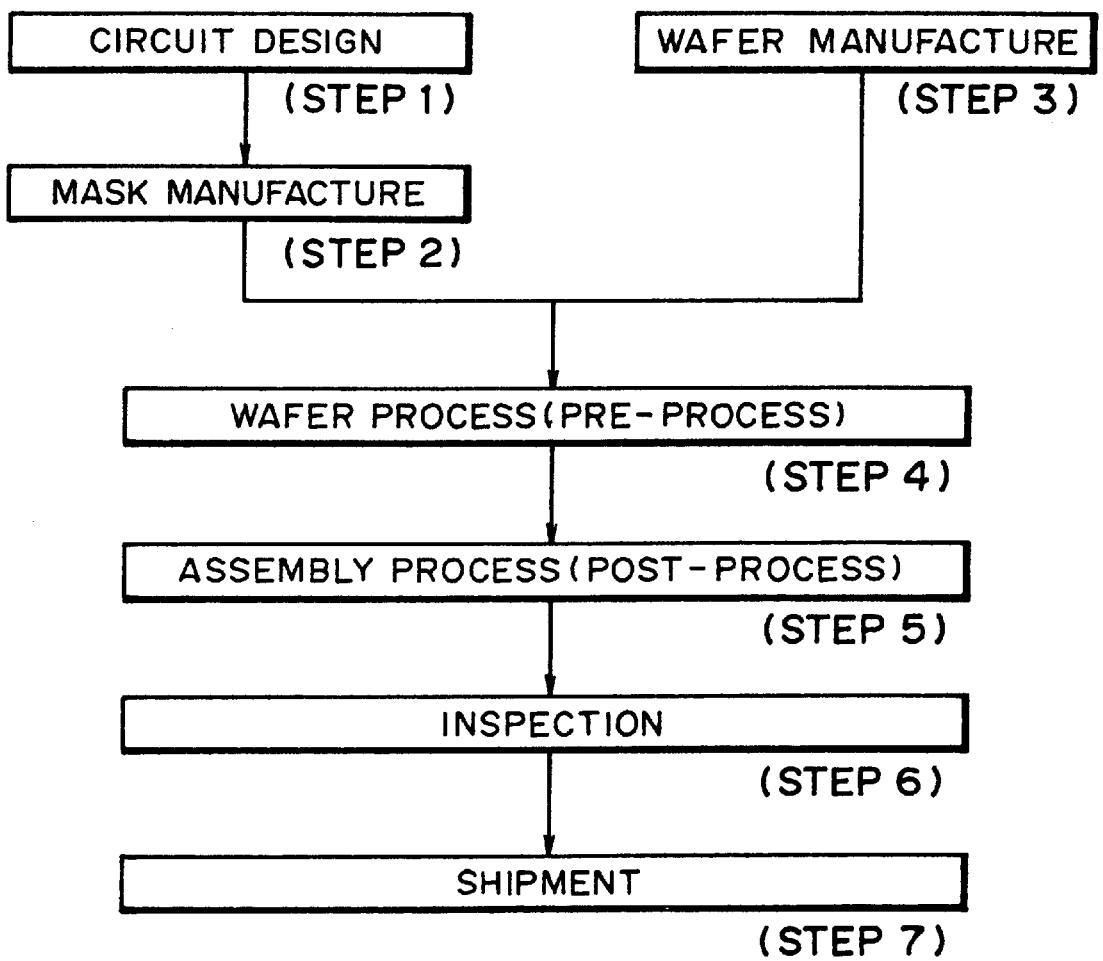
FIG. 20 is a flowchart of semiconductive device manufacturing processes.

FIG. 20 is a flowchart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 21:
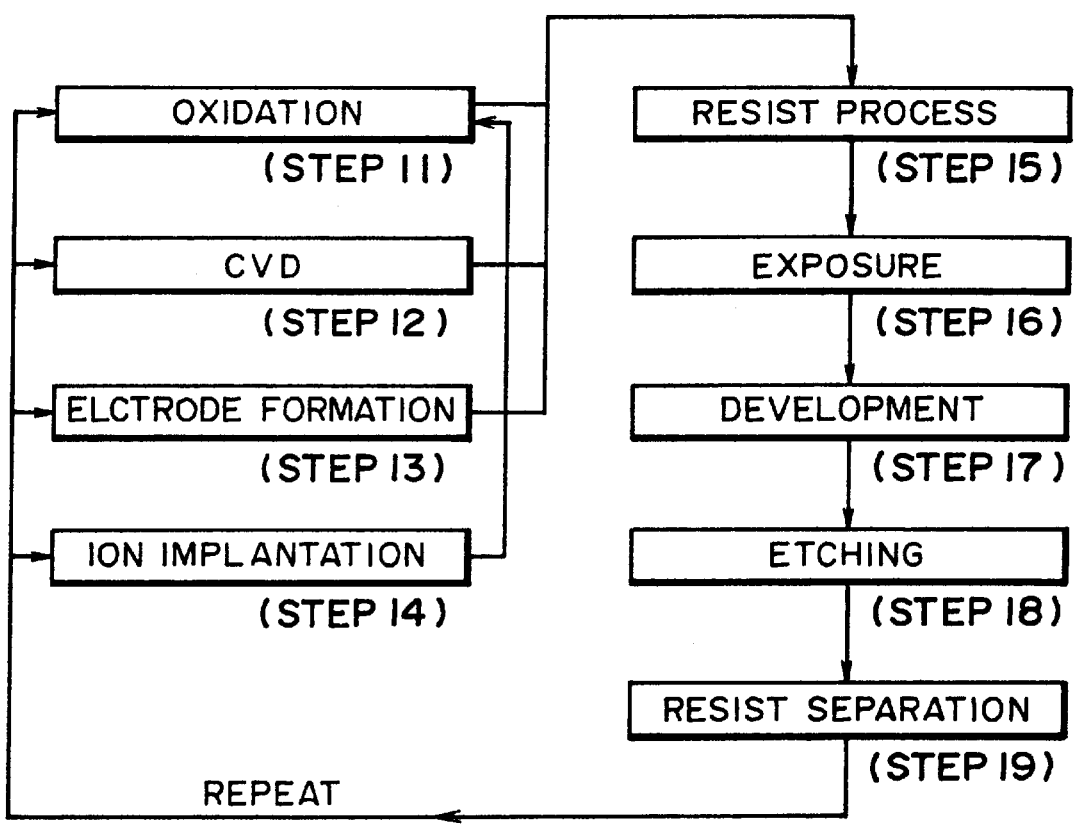
FIG. 21 is a flowchart for explaining details of a wafer process in the sequence of FIG. 20.

FIG. 21 is a flowchart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:

light source means for providing pulse light; and scanning means for relatively and scanningly moving an article, to be illuminated, relative to an illumination region to be defined by the pulse light;

wherein, in a light intensity distribution defined in the illumination region with respect to a scan direction, the light intensity distribution being substantially in the shape of a trapezoid having a substantially straight top portion with at least one corner of the trapezoid being replaced by a curved line to complete the trapezoidal shape, the light intensity changes non-linearly from at least one end portion to a highest light intensity point in the distribution;

wherein the light intensity distribution includes a first point at said one end portion, a second point whereat light intensity increase changes, a third point whereat light intensity increase changes, and a fourth point whereat the light intensity is highest;

wherein the curved line to be replaced by a corner of the trapezoidal shape is protruded downwardly between the first and second points while it is protruded upwardly between the third and fourth points; and wherein at least one of a width Wa between the first and second points and a width Wb between the third and fourth points substantially corresponds to or is greater than the relative movement amount between the illumination region and the article per pulse.

2. A system according to claim 1, wherein the light intensity distribution has a symmetrical shape with respect to the scan direction.

3. A system according to claim 1, wherein the second and third points are coincident with each other.

4. A system according to claim 1, wherein the widths Wa and Wb are equal to each other.

5. A system according to claim 1, wherein portions of the light intensity distribution corresponding to the widths Wa and Wb are able to be approximated by a quadratic curve.

6. A system according to claim 1, further comprising a masking blade disposed at a position out of a plane which is optically conjugate with the article.

7. A system according to claim 1, further comprising a filter for determining the light intensity distribution in the illumination region.

8. A system according to claim 7, wherein said filter is disposed at a position slightly deviated from a plane which is optically conjugate with the article.

9. A system according to claim 7, wherein said filter has a transmissivity changing with the position of light incidence on said filter.

10. A system according to claim 7, wherein said filter comprises a diffraction grating adapted to provide zeroth order diffraction light whose light intensity changes with the position of light incidence on said grating.

11. A system according to claim 10, further comprising blocking means for blocking diffraction light other than the zeroth order diffraction light.

12. A system according to claim 1, further comprising control means for controlling emission time moment of a light pulse on the basis of a light quantity provided by a preceding light pulse.

13. A system according to claim 1, wherein the pulse light comprises excimer laser light.

14. A scan type exposure apparatus, comprising:
    light source means for providing pulse light; and
    scanning means for relatively and scanningly moving a reticle and a wafer relative to an illumination region to be defined by the pulse light;
    wherein, in a light intensity distribution defined in the illumination region with respect to a scan direction, the light intensity distribution being substantially in the shape of a trapezoid having a substantially straight top portion with at least one corner of the trapezoid being replaced by a curved line to complete the trapezoidal shape, the light intensity changes non-linearly from at least one end portion to a highest light intensity point in the distribution;
    wherein the light intensity distribution includes a first point at said one end portion, a second point whereat light intensity increase changes, a third point whereat light intensity increase changes, and a fourth point whereat the light intensity is highest;
    wherein the curved line to be replaced by a corner of the trapezoidal shape is protruded downwardly between the first and second points while it is protruded upwardly between the third and fourth points; and
    wherein at least one of a width Wa between the first and second points and a width Wb between the third and fourth points substantially corresponds to or is greater than the relative movement amount between the illumination region and the reticle and wafer per pulse.

15. An apparatus according to claim 14, wherein the light intensity distribution has a symmetrical shape with respect to the scan direction.

16. An apparatus according to claim 14, wherein the second and third points are coincident with each other.

17. An apparatus according to claim 14, wherein the widths Wa and Wb are equal to each other.

18. An apparatus according to claim 14, wherein portions of the light intensity distribution corresponding to the widths Wa and Wb are able to be approximated by a quadratic curve.

19. An apparatus according to claim 14, further comprising a masking blade disposed at a position out of a plane which is optically conjugate with at least one of the reticle and the wafer.

20. An apparatus according to claim 14, further comprising a filter for determining the light intensity distribution in the illumination region.

21. An apparatus according to claim 20, wherein said filter is disposed at a position slightly deviated from a plane which is optically conjugate with at least one of the reticle and the wafer.

22. An apparatus according to claim 20, wherein said filter has a transmissivity changing with the position of light incidence on said filter.

23. An apparatus according to claim 20, wherein said filter comprises a diffraction grating adapted to provide zeroth order diffraction light whose light intensity changes with the position of light incidence on said grating.

24. An apparatus according to claim 23, further comprising blocking means for blocking diffraction light other than the zeroth order diffraction light.

25. An apparatus according to claim 14, further comprising control means for controlling emission time moment of a light pulse on the basis of a light quantity provided by a preceding light pulse.

26. An apparatus according to claim 14, wherein the pulse light comprises excimer laser light.

27. A device manufacturing method, comprising the steps of:
    illuminating a reticle and a wafer with pulse light; and
    relatively and scanningly moving the reticle and the wafer relative to an illumination region to be defined by the pulse light;
    wherein, in a light intensity distribution defined in the illumination region with respect to a scan direction, the light intensity distribution being substantially in the shape of a trapezoid having a substantially straight top portion with at least one corner of the trapezoid being replaced by a curved line to complete the trapezoidal shape, the light intensity changes non-linearly from at least one end portion to a highest light intensity point in the distribution;
    wherein the light intensity distribution includes a first point at said one end portion, a second point whereat light intensity increase changes, a third point whereat light intensity increase changes, and a fourth point whereat the light intensity is highest;
    wherein the curved line to be replaced by a corner of the trapezoidal shape is protruded downwardly between the first and second points while it is protruded upwardly between the third and fourth points; and
    wherein at least one of a width Wa between the first and second points and a width Wb between the third and fourth points substantially corresponds to or is greater than the relative movement amount between the illumination region and the reticle and wafer per pulse.

28. A method according to claim 27, wherein the light intensity distribution has a symmetrical shape with respect to the scan direction.

29. A method according to claim 27, wherein the second and third points are coincident with each other.

30. A method according to claim 27, wherein the widths Wa and Wb are equal to each other.

31. A method according to claim 27, wherein portions of the light intensity distribution corresponding to the widths Wa and Wb are able to be approximated by a quadratic curve.

32. A method according to claim 27, further comprising placing a masking blade at a position out of a plane which is optically conjugate with at least one of the reticle and the wafer, to thereby determine the shape of the illumination region and to thereby provide the light intensity distribution in the illumination region.

33. A method according to claim 27, further comprising placing a filter on a light path to determine the light intensity distribution in the illumination region.

34. A method according to claim 33, wherein the filter is disposed at a position slightly deviated from a plane which is optically conjugate with at least one of the reticle and the wafer.

35. A method according to claim 33, wherein the filter has a transmissivity changing with the position of light incidence on said filter.

36. A method according to claim 33, wherein the filter comprises a diffraction grating adapted to provide zeroth order diffraction light whose light intensity changes with the position of light incidence on said grating.

37. A method according to claim 36, further comprising blocking diffraction light other than the zeroth order diffraction light.

38. A method according to claim 27, further comprising controlling emission time moment of a light pulse on the basis of a light quantity provided by a preceding light pulse.

39. A method according to claim 27, wherein the pulse light comprises excimer laser light.

* * * * *

UNITED STATES PATENT AND TRADEMARK OFFICE
CERTIFICATE OF CORRECTION

PATENT NO. : 6,081,319

DATED : June 27, 2000

INVENTOR(S) : OZAWA ET AL.

It is certified that error appears in the above-identified patent and that said Letters Patent is hereby corrected as shown below:

SHEET 1
Figure 1, "LIGH" should read --LIGHT--.

COLUMN 1
Line 31, "number times" should read --number of times--; and
Line 60, "a" should be deleted; and "the" should read
--an--.

COLUMN 3
Line 20, "of" should read --of a--; and
Line 53, "semiconductive" should read --semiconductor--.

COLUMN 4
Line 20, "in" should read --is--.

UNITED STATES PATENT AND TRADEMARK OFFICE
CERTIFICATE OF CORRECTION

PATENT NO. : 6,081,319

DATED : June 27, 2000

INVENTOR(S) : OZAWA ET AL.

It is certified that error appears in the above-identified patent and that said Letters Patent is hereby corrected as shown below:

COLUMN 5
Line 54, "where the pulse light" should read ??

COLUMN 6
Line 15, "abovedescribed" should read --above-described--;
Line 38, "as" should read --as in--; and
Line 54, "out" should read --out of--.

COLUMN 7
Line 1, "fixed" should read --a fixed--;
Line 37, "the" (first occurrence) should be deleted; and
Line 38, "a" should read --at a--.

Signed and Sealed this

Twenty-second Day of May, 2001

Attest:

NICHOLAS P. GODICI

Attesting Officer

Acting Director of the United States Patent and Trademark Office